United States Patent
Chung et al.

(10) Patent No.: US 7,438,563 B2
(45) Date of Patent: Oct. 21, 2008

(54) CONNECTOR FOR TESTING A SEMICONDUCTOR PACKAGE

(75) Inventors: Young-Bae Chung, Seoul (KR); Hyun-Seop Shim, Incheon Metropolitan (KR); Jeong-Ho Bang, Gyeonggi-do (KR); Jae-Il Lee, Gyeonggi-do (KR); Hyun-Kyo Seo, Chungcheongnam-do (KR); Young-Soo An, Gyeonggi-do (KR); Soon-Geol Hwang, Chungcheongnam-do (KR)

(73) Assignees: Samsung Electronics Co., Ltd., Suwon-si, Gyeonggi-do (KR); ISC Technology Co., Ltd., Seongnam-si, Gyeonggi-do (KR)

( * ) Notice: Subject to any disclaimer, the term of this patent is extended or adjusted under 35 U.S.C. 154(b) by 0 days.

(21) Appl. No.: 11/295,208

(22) Filed: Dec. 5, 2005

(65) Prior Publication Data

US 2006/0121757 A1    Jun. 8, 2006

(30) Foreign Application Priority Data

Dec. 6, 2004    (KR) .................. 10-2004-0101799

(51) Int. Cl.
*H01R 4/58* (2006.01)
(52) U.S. Cl. .......................... 439/91; 439/66
(58) Field of Classification Search .......... 439/91, 439/66, 90, 86, 591
See application file for complete search history.

(56) References Cited

U.S. PATENT DOCUMENTS

| 4,838,347 | A | * | 6/1989 | Dentini et al. ............. 174/16.3 |
| 5,624,268 | A | * | 4/1997 | Maeda et al. ................ 439/66 |
| 5,819,406 | A | * | 10/1998 | Yoshizawa et al. ............ 29/877 |
| 6,181,149 | B1 | | 1/2001 | Godfrey et al. |
| 6,574,114 | B1 | | 6/2003 | Brindle et al. |
| 6,604,953 | B2 | * | 8/2003 | Igarashi et al. ............... 439/91 |

(Continued)

FOREIGN PATENT DOCUMENTS

JP    10-200242    7/1998

(Continued)

OTHER PUBLICATIONS

English language abstract of Korean Publication No. 20-0182523.

(Continued)

*Primary Examiner*—Felix O. Figueroa
(74) *Attorney, Agent, or Firm*—Marger Johnson & McCollom, P.C.

(57) ABSTRACT

In one embodiment, a connector is made using a mixture of insulating silicone powder and conductive powder. The connector comprises a connector body formed from the insulating silicone powder and on or more preferably regularly arrayed conductive silicone members that are formed by migrating the conductive powder to a site of the connector corresponding to a solder ball of the semiconductor package. The conductive silicone member comprises a high-density conductive silicone part formed to be proximate an upper surface of the connector body and to protrude therefrom and a low-density conductive silicone part formed in substantial vertical alignment beneath the high-density conductive silicone part, the low-density conductive silicone part having a lower surface exposed from a lower surface of the connector body.

32 Claims, 9 Drawing Sheets

U.S. PATENT DOCUMENTS

2005/0048695 A1 * 3/2005 Chia et al. .................. 438/106

FOREIGN PATENT DOCUMENTS

| | | |
|---|---|---|
| JP | 2000-82511 | 3/2000 |
| JP | 2000-180504 | 6/2000 |
| JP | 2002-005992 | 1/2002 |
| KR | 20-0182523 | 3/2000 |
| KR | 2001-0065749 | 7/2001 |
| KR | 20-0247732 | 9/2001 |
| KR | 2002-0024419 | 3/2002 |
| KR | 20-0278989 | 6/2002 |
| KR | 2002-0079350 | 10/2002 |
| KR | 20-0312739 | 4/2003 |
| KR | 20-0368243 | 11/2004 |

OTHER PUBLICATIONS

English language abstract of Korean Publication No. 20-0247732.
English language abstract of Korean Publication No. 20-0278989.
English language abstract of Korean Publication No. 2002-0024419.
English language abstract of Korean Publication No. 20-0312739.
English language abstract of Japanese Publication No. 2000-180504.
English language abstract of Japanese Publication No. 2002-005992.

* cited by examiner

CONNECTOR FOR TESTING A SEMICONDUCTOR PACKAGE

CROSS REFERENCE TO RELATED APPLICATIONS

This U.S. non-provisional application claims benefit of priority under 35 U.S.C. §119 of Korean Patent Application No. 2004-101799, filed on Dec. 6, 2004, the entire contents of which are incorporated herein by reference.

BACKGROUND

1. Field of the Invention

The present invention relates generally to a silicone connector for testing a semiconductor package. More particularly, it concerns the use therein of a low-density conductive silicone member that is subject to wear or damage from pressure applied by a solder ball of the semiconductor package.

2. Description of the Related Art

A manufactured semiconductor packages undergoes various tests to ensure its reliability. Generally, there are two kinds of package tests: electrical characteristic and burn-in tests. The electric characteristic test examines the behavior and connection of a package under test by connecting all of its input/output (I/O) signal terminals to test-signal generating circuits under normal operating conditions. The burn-in test examines the endurance of the package under test by connecting some of its I/O signal terminals to test-signal generating circuits and stressing the package at elevated temperature and voltage.

In both tests, a connector is utilized for supporting a semiconductor package to make electrical and mechanical contact with the package, the connector acting as a medium to connect external interface terminals of the package with a test substrate. The shape of the connector usually depends upon the type of the semiconductor package.

For a ball grid array (BGA) type package having solder balls as external interface terminals, the connector has probe needles embedded in a plastic body, as disclosed in Korean Utility Model Gazette Nos. 182523 (Mar. 7, 2000) and 247732 (Sep. 11, 2001). Spring-loaded, so-called "pogo" pins are commonly utilized as the probe needles.

More and more finely pitched (linearly spaced, typically expressed in pins/centimeter) pogo pins of the connector are needed to test thinner and smaller semiconductor packages having more and more finely pitched solder balls, such as chip scale packages (CSP) and wafer level chip scale packages (WLCSP). However, the pitch of pogo pins cannot become finer without limit. Pogo pins may cause damage to the solder balls during the at least two-step test process, thereby increasing the occurrences of deformation defects in packages. Shortening the length of the pogo pins is necessary to cope with ultrahigh test signal frequencies, but it is difficult to manufacture the pogo pins that are less than or equal to 3 mm long.

To reduce damage to the solder balls of a semiconductor package for ultrahigh test signal frequencies, a silicone connector 100, as shown in FIGS. 1 to 3, is utilized. The conventional silicone connector 100 is a connector for testing semiconductor packages, which is made by solidifying insulating silicone powder 25 and conductive powder 35. The silicone connector 100 comprises a connector body 20 and a low-density conductive silicone member 30. The connector body 20 is made of the solidified insulating silicone powder 25. The low-density conductive silicone member 30 is made by bringing the conductive powder 35 to a site of the connector body 20 corresponding to a solder ball of a semiconductor package under test. The silicone member 30 is positioned and oriented to be perpendicular to the connector body 20, like a pillar, as shown.

The lower surface 31 of the low-density conductive silicone member 30 is exposed from the lower surface 21 of the connector body 20. The lower surface 21 contacts with a substrate pad of a test substrate (91 in FIG. 4) to form an electrical connection. The upper surface 33 of the low-density conductive silicone member 30 is exposed from the upper surface 23 of the connector body 20, and contacts with a solder ball of the semiconductor package under test (81 in FIG. 4) to form an electrical connection.

The conventional silicone connector 100 typically is manufactured as follows. First, the insulating silicone powder 25 and the conductive powder 35 are mixed at a predefined ratio and are melted in a mold frame. Second, the conductive powder 35 is brought to a site where the low-density conductive silicone member 30 will be formed, as illustrated schematically in FIG. 3. Specifically, electric power applied selectively to the site where the low-density conductive silicone member 30 will be formed brings the conductive powder 35 contained in the melted silicone mixture to the formation site. Third, the conventional silicone connector 100 is completed by solidifying the melted silicone mixture.

How the conventional silicone connector 100 contacts with the semiconductor package 80 is explained with reference to FIG. 4 as follows. First, a test substrate 90 having the silicone connector 100 installed thereon is prepared. The lower surface 31 of the low-density conductive silicone member 30, exposed from the lower surface 21 of the connector body 20, contacts with a substrate pad 91 of the test substrate 90 to form an electrical connection.

Next, a solder ball 81 of the semiconductor package 80, located above the upper surface 23 of the silicone connector body 20, applies a designated force on the upper surface 33 of the low-density conductive silicone member 30, producing an elastic contact therewith to form an electrical connection. Finally, package tests are conducted by flowing test signals from the test substrate 90 to the semiconductor package 80 via the silicone connector 100.

Because the silicone connector 100 including the low-density conductive silicone member 30 is made of relatively soft and elastic materials, the force applied by the solder ball 81 of the semiconductor package 80 tends to depress the upper surface 33 of the low-density conductive silicone member 30 so as to enclose a periphery of the solder ball 81 in a slight recess, as shown. This slight interference fit and resulting soft-material deformation is desirable, as it produces a robust electrical connection. The low-density conductive silicone member 30 bulges out slightly in the middle, and the lower and upper surfaces 21 and 23 of the connector body 20 enclosing the low-density conductive silicone member 30 also bulge slightly, as shown, respectively down and up.

Undesirably, however, the low-density conductive silicone member 30 is relatively soft and thus is susceptible to wear or damage caused by repeated contact with the solder ball 81 of the semiconductor package 80. This is because over its useful life the silicone connector 100 has repeatedly to contract and expand in contact with successive ones of the semiconductor package 80 being tested. A defect can develop from hollows or voids or pits at the upper surface 33 of the low-density conductive silicone member 30 caused by the repeated pressure from the solder ball 81. Consequently, the conventional silicone connector 100 has to be replaced frequently due to wear and ultimate test failure-prone damage to the low-density conductive silicone members 30. Higher test costs are incurred.

To solve this problem, a silicone connector having a metal ring at the upper end of a low-density conductive silicone member is disclosed in Korean Utility Model Gazette No. 278989. The metal ring interposed at the upper end of the low-density conductive silicone member tends to prevent hollows at the upper ends of the low-density conductive silicone member caused by the repeated pressure of the solder ball thereon. The metal ring accordingly may help lengthen the life span of the silicone connector.

Unfortunately, the low-density conductive silicone member is relatively soft, and the proposed metal ring is relatively hard. Thus another problem arises with use of the proposed metal ring: The metal ring can detach from the upper end of the low-density conductive silicone member due to the repeated deformation and restoration of the shape of the silicone connector caused by the repeated contact with the solder balls of the semiconductor package under test.

Another silicone connector having a metal plate at the upper end of a low-density conductive silicone member is disclosed in Korean Utility Model Gazette No. 312739. The metal plate might protect the low-density conductive silicone member, and the metal plate might thereby help lengthen the life span of the silicone connector.

Unfortunately, the proposed metal plate completely covers the upper end of the corresponding low-density conductive silicone member. Moreover, the metal plate is relatively hard. Finally, the metal plate provides an inherently less stable and reliable electrical contact with a solder ball than does the relatively soft low-density conductive silicone member.

The contacting pressure can be increased for stable electrical contact between the metal plate and the solder ball of the semiconductor package. But the increased pressure can cause damage to the low-density conductive silicone member, thereby generating a recurring problem of significantly reduced elasticity. Specifically, an undamaged silicone connector returns back to its initial state owing to its own elasticity, i.e. it is shape-retentive. However, the repeated increased pressure applied by the metal plate may accelerate damage to the low-density conductive silicone member, and a damaged silicone connector does not reliably return to its initial state, i.e. it is permanently deformed and thus damaged and test failure-prone.

In addition, the metal plate requires extra manufacturing steps such as plating, etching, and coating, leading to a more complex and costly manufacturing process.

Finally, a big difference between the coefficients of elasticity of the metal plate and the low-density conductive silicone member can cause a delamination phenomenon at their interfacing surface, thereby leading to a serious failure mode in which the metal plate detaches from the upper end of the low-density conductive silicone member.

Accordingly, the present invention is to provide, among other things, a silicone connector that may protect the low-density conductive silicone member having good junction properties, forming robust electrical and mechanical contact, and using existing connector-manufacturing methods.

SUMMARY

According to one embodiment, a silicone connector for testing a semiconductor package is made by solidifying insulating silicone powder and conductive powder in the region of the connector that mates the solder ball of a semiconductor package. The silicone connector comprises a connector body formed from the insulating silicone powder, and a conductive silicone member that is formed in two parts. The conductive silicone member includes a first solder-ball contact disk-shaped part formed of a high-density conductive silicone extends upwardly from an upper surface of the connector body to protrude slightly therefrom and a second column-shaped part formed of a low-density conductive silicone thereebeneath having its lower surface exposed from the lower surface of the connector body.

According to an embodiment of the present invention, the high-density conductive silicone part may be formed on the upper surface of the connector body. It is preferable that the high-density conductive silicone part is dimensioned laterally sufficiently to substantially cover the upper surface of the low-density conductive silicone part.

According to another embodiment of the present invention, the lower end of the low-density conductive silicone part may protrude from the lower surface of the connector body. A support tape may be adhered to the lower surface of the connector body excluding the portion occupied by the lower end of the low-density conductive silicone part, or a silicone adhesive may be applied to a periphery of the lower end of the low-density conductive silicone part. The support tape may be made of polyimide.

According to another embodiment of the present invention, the silicone connector may further comprise a metal ring formed around a periphery of the high-density conductive silicone part. The metal ring may be made of beryllium copper (BeCu).

According to another embodiment of the present invention, the silicone connector may further comprise a lower-surface high-density conductive silicone part formed at the lower surface of the low-density conductive silicone part.

According to yet another embodiment of the present invention, the connector body and the low-density conductive silicone part may be made of a silicone mixture containing the insulating silicone powder and the conductive powder at a ratio of approximately 1:1. The high-density conductive silicone part may have a composition of between 80 and 90 percent conductive powder with the between 10 and 20 percent balance being insulating silicone powder. The conductive powder forming the conductive silicone member may be metallic powder made of gold (Au)-coated nickel (Ni) particles.

Those of skill in the art will appreciate that other embodiments of the invention are contemplated, and that, without limitation, such are within the spirit and scope of the invention.

DETAILED DESCRIPTION

Hereinafter, example embodiments of the present invention will be described in detail with reference to the accompanying drawings.

First Example Embodiment

Figure 1:
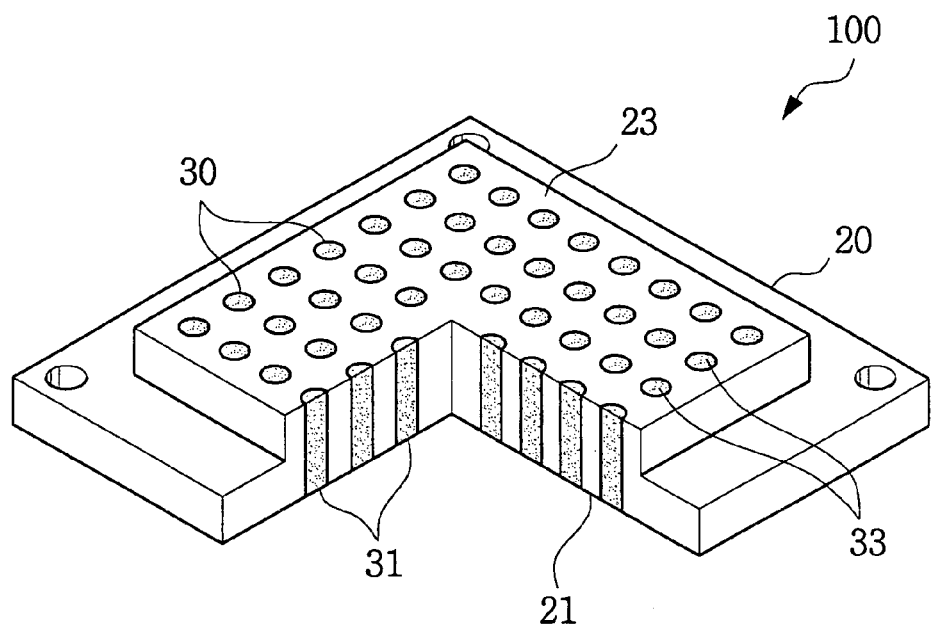
FIG. 1 is a partially sectioned isometric view showing a conventional silicone connector for testing a semiconductor package.
Figure 2:
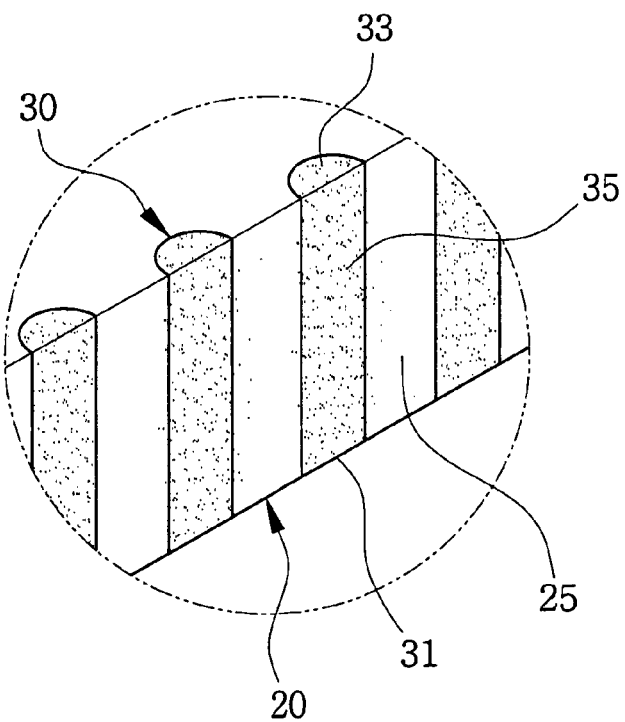
FIG. 2 is an enlarged isometric view showing low-density conductive silicone members of the silicone connector of FIG. 1.
Figure 3:
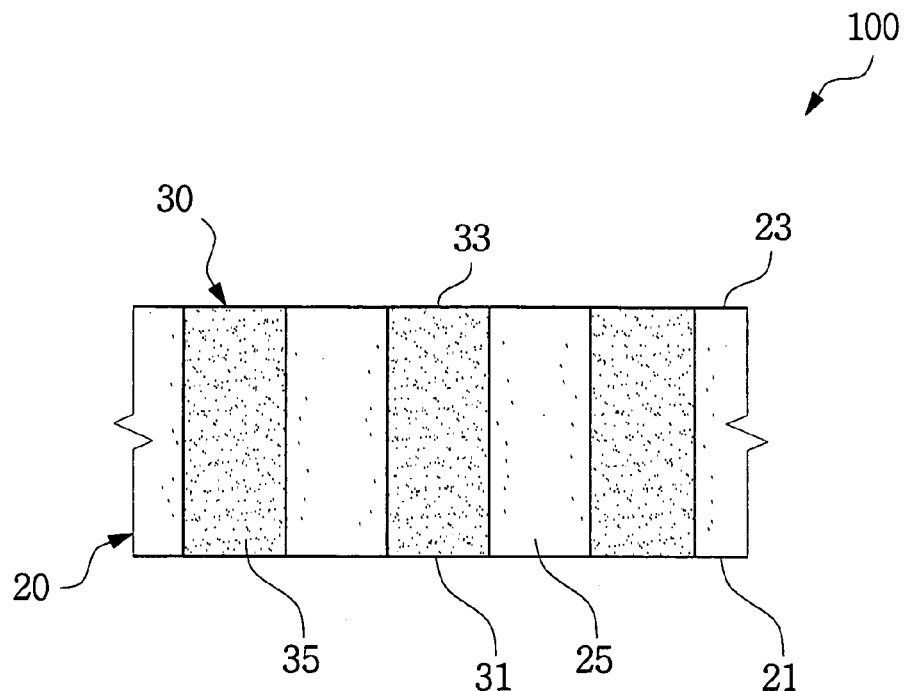
FIG. 3 is a sectional front elevation showing a portion of the silicone connector of FIG. 1.
Figure 4:
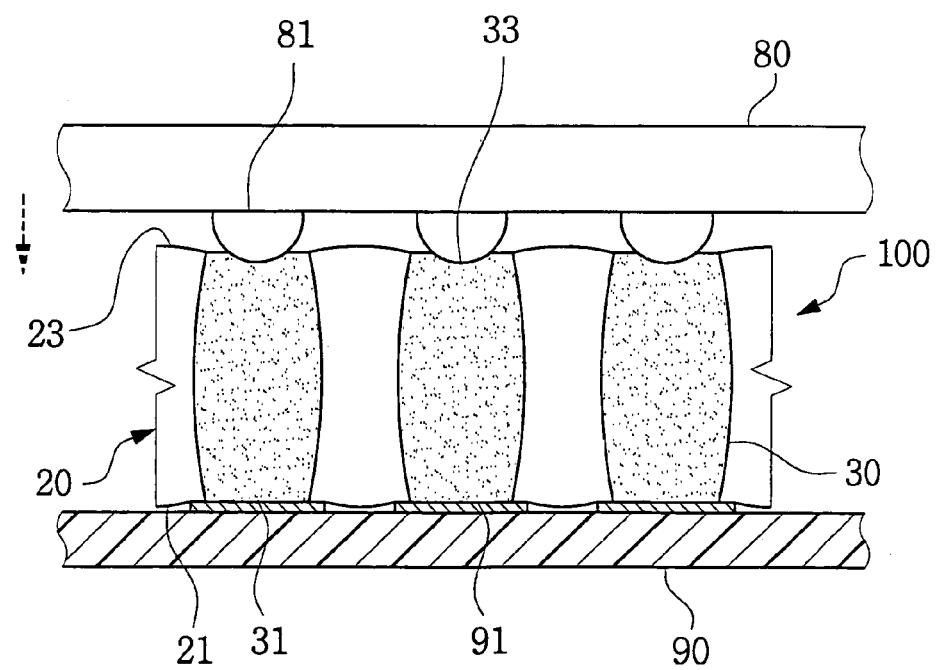
FIG. 4 is a sectional front elevation showing how the silicone connector of FIG. 1 contacts with a semiconductor package under test.
Figure 5:
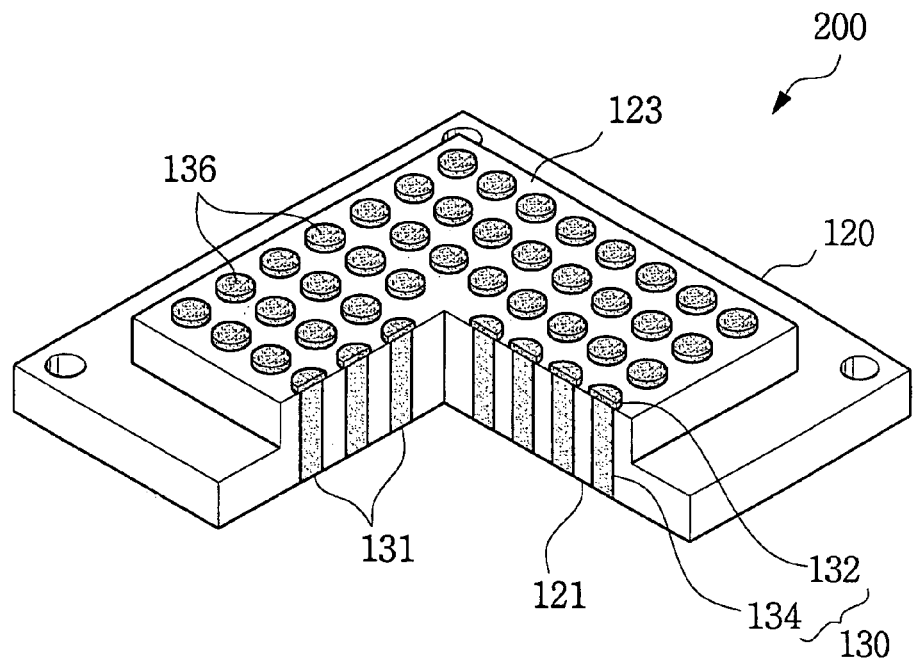
FIG. 5 is a partially sectioned isometric view showing a silicone connector for testing a semiconductor package according to a first embodiment of the present invention.
Figure 6:
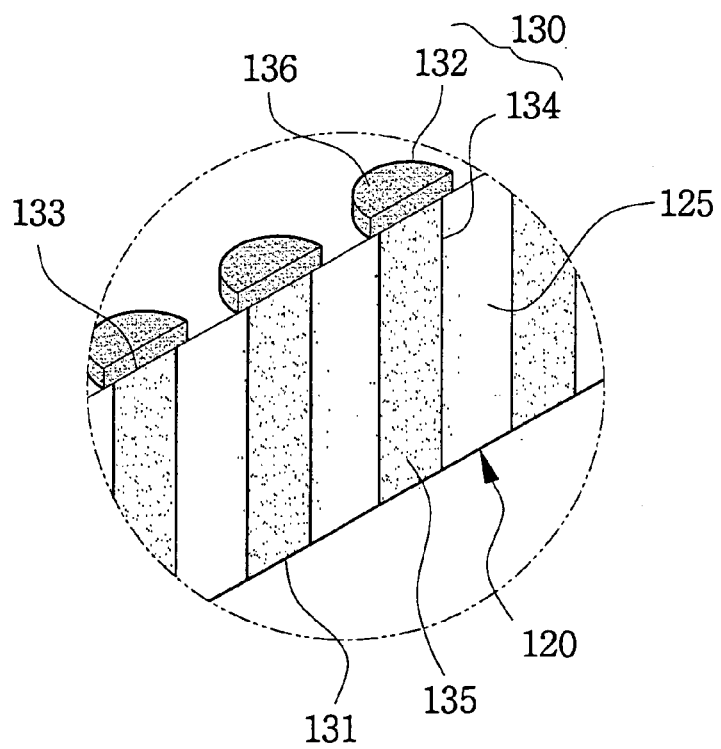
FIG. 6 is an enlarged sectioned isometric view showing conductive silicone members of the silicone connector of FIG. 5.
Figure 7:
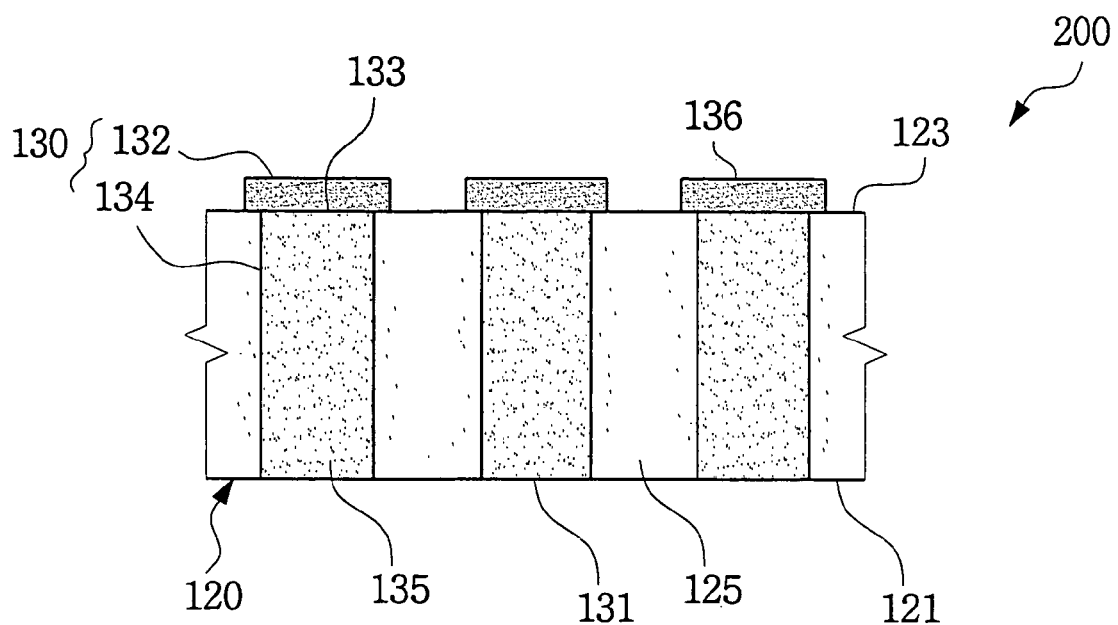
FIG. 7 is a sectional front elevation showing a portion of the silicone connector of FIG. 5.

FIG. 5 is a partially sectioned isometric view showing a silicone connector 200 for testing a semiconductor package according to a first example embodiment of the present invention. FIG. 6 is an enlarged detailed cutaway view showing conductive silicone members 130 of the silicone connector of FIG. 5. FIG. 7 is a sectional elevation showing a portion of the silicone connector 200 of FIG. 5.

Referring to FIGS. 5 to 7, the silicone connector 200 according to the first example embodiment is a connector for testing semiconductor packages, which is made by solidifying a silicone powder region 125 and plural conductive powder regions 135. The silicone connector 200 comprises a connector body 120 and one or more, preferably plural and regularly arrayed, instances of a conductive silicone member 130. The connector body 120 is made of an expansive solidified silicone powder region 125. Each conductive silicone member 130 is made with the conductive powder in regions 135 and 136 (referred to herein respectively as a first part and a second part of the conductive silicone member 130) near a site of the connector body 120 corresponding to a solder ball of a semiconductor package under test. Each conductive silicone member 130 is formed, e.g. positioned and oriented, to be perpendicular to the connector body 120, like a pillar.

In particular, the conductive silicone member 130 according to the first example embodiment comprises a high-density conductive silicone powder part 132 and a low-density conductive silicone powder part 134. The upper surface 136 of the high-density conductive silicone part 132 protrudes slightly from the upper surface 123 of the connector body 120, and contacts with a solder ball of a semiconductor package under test to form an electrical connection. The low-density conductive silicone powder part 134 is formed under the high-density conductive silicone part 132. The lower surface 131 of the low-density conductive silicone part 134 is exposed from the lower surface 121 of the connector body 120, and contacts with a substrate pad of a test substrate to form an electrical connection.

In the conductive silicone member 130 according to the first example embodiment, the high- and low-density conductive silicone parts 132 and 134 have different concentrations of the conductive powder 135. The high-density conductive silicone part 132 is formed, as illustrated, in substantial vertical alignment with and immediately above the low-density conductive silicone part 134. Accordingly, when the high-density conductive silicone part 132 contacts with a solder ball of a semiconductor package, it acts as a buffer to absorb mechanical stress applied indirectly therethrough to the low-density conductive silicone part 134.

In addition, the high-density conductive silicone part 132 has stronger metallic properties than the low-density conductive silicone part 134. It also has a greater coefficient of elasticity than the prior art metallic plate because it is formed of silicone powder 125. As a beneficial result, it provides a more robust electrical contact with a solder ball of a semiconductor package.

Structural aspects of the silicone connector 200 according to the first example embodiment are explained in detail as follows. The silicone connector 200 is formed by mixing the silicone powder 125 and the conductive powder 135 at a predefined ratio. The conductive powder 135 preferably is made of gold (Au)-coated nickel (Ni) particles. The silicone powder 125 is preferably made of a non-conductive insulating silicone powder.

The connector body 120 is formed mainly from the solidified silicone powder 125, but it also might contain a very small residual amount of the conductive powder 135 that did not fully migrate, during selective application of an electrical potential, to the low-density conductive silicone parts 134. This is illustrated in FIGS. 6, 7 and 8C by hash marks outside the boundaries of the of the low-density conductive silicone parts 134.

The low-density conductive silicone part 134 may be made of the solidified silicone powder 125 containing the conductive powder 135, and acts as an elastic body absorbing pressure applied by the semiconductor package to the silicone connector 200. The low-density conductive silicone part 134 is formed by mixing the silicone powder 125 and the conductive powder 135 at a ratio of approximately 1:1. The ends of the low-density conductive silicone part 134 are exposed from the upper and lower surface of the connector body 120.

The high-density conductive silicone part 132 is formed on the exposed upper surface 133 of the low-density conductive silicone part 134. The high-density conductive silicone part 132 is dimensioned laterally sufficiently to cover the upper surface 133 of the low-density density conductive silicone part 134, thereby to cap and protect the low-density conductive silicone part 134.

The high-density conductive silicone part 132 has a higher concentration of the conductive powder 135 than does the low-density conductive silicone part 134. It is preferable to formulate the high-density conductive silicone part 132 with between approximately 80 and 90 percent (by weight) conductive powder 135, with the approximately 10-20 percent (by weight) balance being silicone powder 125. It has been discovered that, if the concentration of the conductive powder 135 is less than or equal to approximately 80 percent then there might be no meaningful difference between the characteristics of the high and low-density conductive silicone parts 132 and 134. This is believed to be because the high-density conductive silicone part 132 becomes hard but not hard enough to produce better results than the low-density conductive silicone part 134. On the other hand, it has also been discovered that, if the concentration of the conductive powder 135 is greater than or equal to approximately 90 percent then the high-density conductive silicone part 132 becomes too hard and might cause problems similar to those of the metal plate disclosed in Korean Utility Model Gazette No. 312739.

Those of skill in the art will appreciate that the relative concentrations of the high-density and the low-density conductive silicone parts 132 and 134, within the spirit and scope of the invention, can vary within any suitable functional range that balances the competing concerns for robust electrical contact without undue detachment, wear or damage.

Figure 8A:
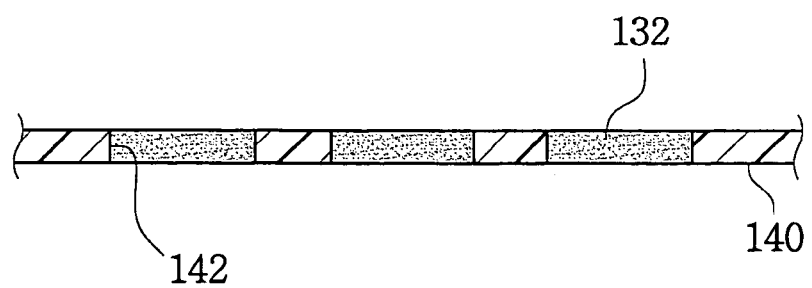
FIGS. 8A to 8C are sectional front elevations showing steps of a manufacturing method of the silicone connector of FIG. 5.
Figure 8B:
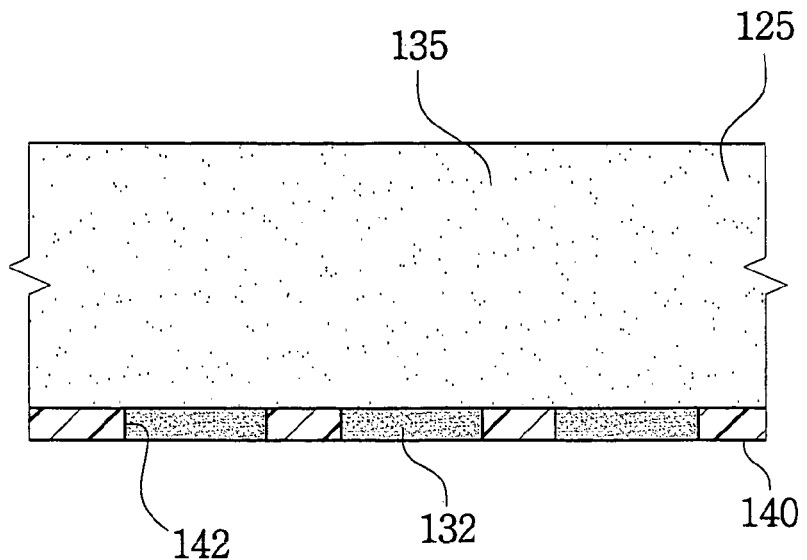
Figure 8C:
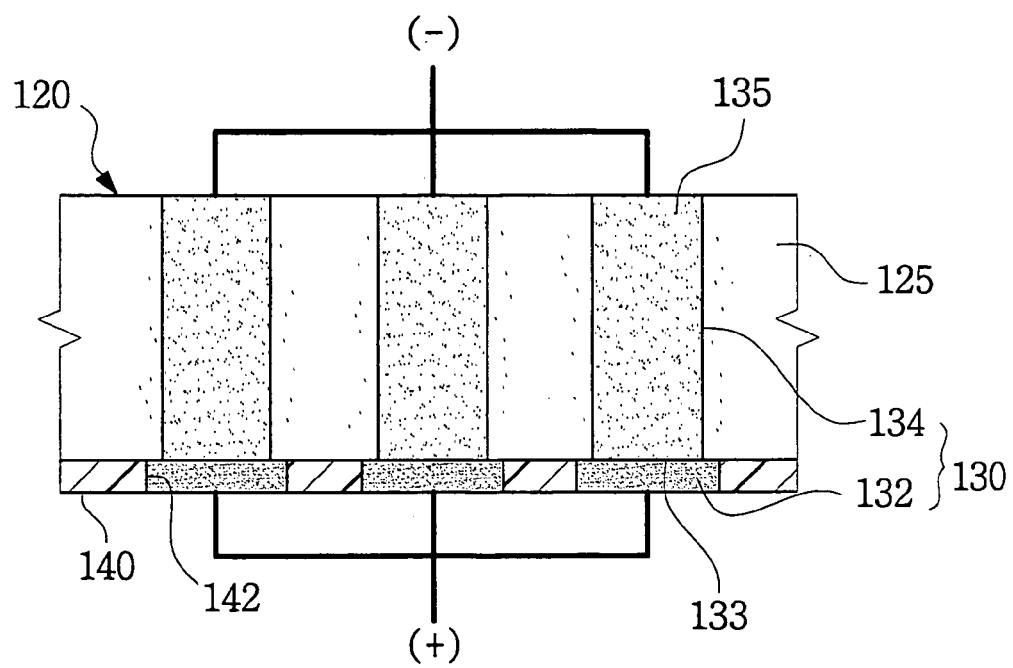

FIGS. 8A to 8C are sectional views showing steps of a manufacturing method of the silicone connector of FIG. 5. Referring thereto, the method of manufacturing the silicone connector 200 according to the first example embodiment is explained.

First, as shown in FIG. 8A, a base layer or strip, e.g. tape, 140 having an opening 142 at a site where the high-density conductive silicone part 132 will be formed, is prepared. The base layer 140 may be made of polyimide.

Second, the high-density conductive silicone part 132 is formed within the opening 142. Specifically, a first silicone mixture containing a relatively high percentage of conductive powder is filled in the opening 142, melted and then solidified, thereby forming the high-density conductive silicone part 132. It is preferable to formulate the first silicone mixture of between approximately 80 and 90 percent conductive powder 135, with the approximately 10-20 percent balance being silicone powder 125.

Third, as shown in FIG. 8B, a second silicone mixture containing a relatively low percentage of the conductive powder in region 135, which will become the connector body and the low-density conductive silicone part, is laid over the base layer 140 and melted. It is preferable to formulate the second silicone mixture of approximately 50 percent (by weight) conductive powder 135, with the approximately 50 percent (by weight) balance being silicone powder 125.

Fourth, as shown in FIG. 8C, a positive electric potential (+) is applied to the center of the high-density conductive silicone part 132, contrasted with a ground or negative potential (−) applied to the center of the low-density conductive silicone part 135. This electrical potential difference causes the conductive powder 135 contained in the melted second silicone mixture to migrate into the columnar region 134 directly above the high-density conductive silicone part 132.

Fifth, the connector body 120 and the low-density conductive silicone part 134 are obtained by solidifying the melted second silicone mixture.

Finally, the silicone connector 200 according to the first example embodiment, as shown in FIG. 7, is obtained by removing the base layer 140.

The high and low-density conductive silicone parts 132 and 134 can have identical compositions except for a difference in concentration of the conductive powder 135, so that the interface therebetween at the upper surface 133 of the low-density conductive silicone part 134 (refer to FIG. 7), has excellent junction properties. This distinguishes the invention over the proposed prior art solutions, which, as discussed above, involve disparate materials at this interface.

Those of skill in the art will appreciate that the silicone connector 200 according to the first example embodiment can be manufactured by an alternative method. For example, the high- and low-density conductive silicone parts 132 and 134 may be solidified concurrently, even though by the above description the high-density conductive silicone part 132 is solidified before the low-density conductive silicone part 134.

Figure 9:
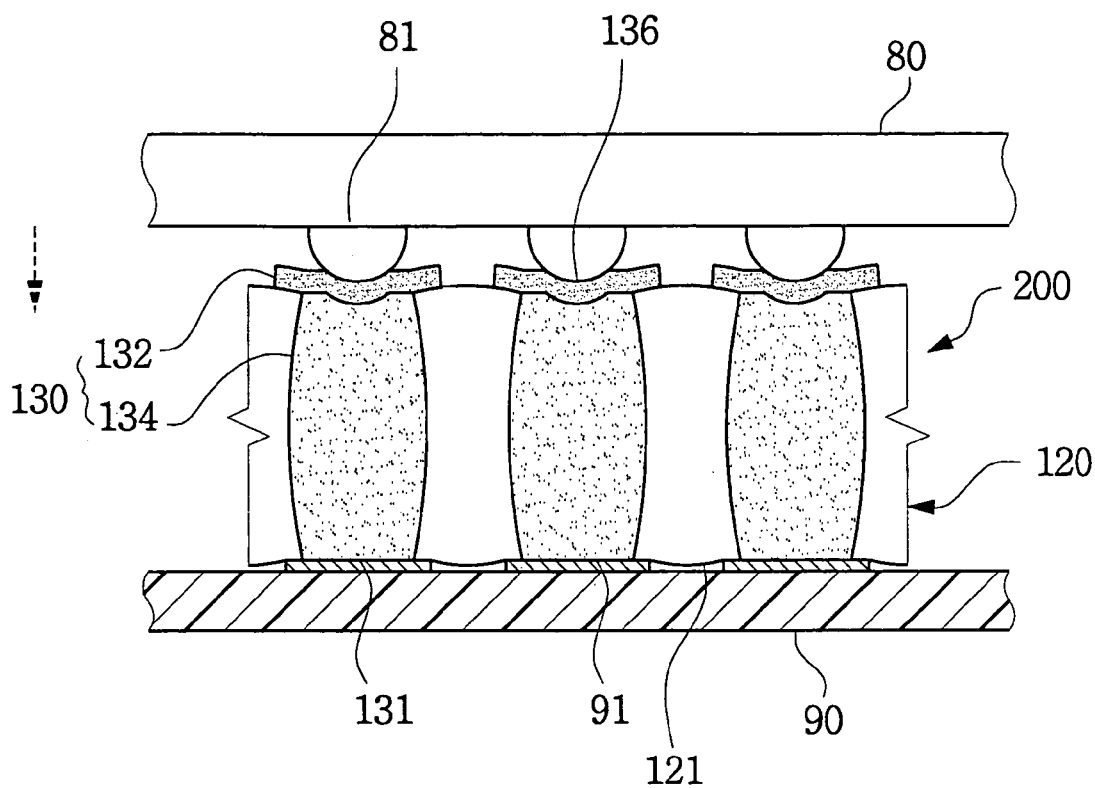
FIG. 9 is a sectional front elevation showing how the silicone connector of FIG. 5 contacts with a semiconductor package under test.

How to utilize the silicone connector 200 according to the first example embodiment for testing a semiconductor package is explained with reference to FIG. 9. First, a test substrate 90 having the silicone connector 200 installed on its upper surface is prepared. The lower surface 131 of the low-density conductive silicone part 134, exposed from the lower surface 121 of the connector body 120, contacts with a substrate pad 91 of the test substrate 90.

Second, the semiconductor package 80 to be tested is aligned on the silicone connector 200 so that a solder ball 81 of the semiconductor package 80 faces the upper part of the silicone connector 200. Those of skill in the art will appreciate that the plural semiconductor packages 80 be transferred one at a time by any suitable conveyance means, or they can be loaded in a tray, transferred in a batch, and then serially aligned for test, as shown. If the semiconductor package 80 is loaded in a tray and transferred, the silicone connector 200 is installed at a position to correspond with a given semiconductor package 80 loaded in the tray. The semiconductor package 80 typically is a CSP or WLCSP having hemispheric solder balls on its lower surface. It will be appreciated that it is irrelevant to the invention whether the connector 200 or the semiconductor package 80 is moved relative to the other into test alignment.

Finally, the semiconductor package 80 is pressed downwards (as indicated by a dashed arrow in FIG. 9) to closely contact the silicone connector 200 so that the solder ball 81 of the semiconductor package 80 elastically contacts the conductive silicone member 130. Specifically, the force pressing downwardly on the semiconductor package 80 (or, alternatively but still within the spirit and scope of the invention, upwardly on the connector 200) causes the hemispheric solder ball 81 to slightly depress the upper surface 136 of the high-density conductive silicone part 132 and to be compressively cradled thereby. The depressed high-density conductive silicone part 132 recesses downwardly and inwardly to cradle a lower periphery of the solder ball 81, thereby forming a smooth but forceful and slightly expanded contact region (it being semicircular rather than linear). The force applied by the semiconductor package 80 is absorbed by the low-density conductive silicone part 134 and the connector body 120 under the high-density conductive silicone part 132, so the solder ball 81 of the semiconductor package 80 elastically contacts with the conductive silicone member 130 forming a robust and reliable electrical connection.

After establishing an electrical connection between the test substrate 90 and the semiconductor package 80 via the silicone connector 200, test processes may be performed by supplying test signals from the substrate pad 91 of the test substrate 90 through the conductive silicone member 130 of the silicone connector 200 to the solder ball 81 of the semiconductor package 80 to the signal path within the semiconductor package connected thereto.

Accordingly, in the silicone connector 200 according to the first example embodiment, the high-density conductive silicone part 132 electrically contacts with the solder ball 81 of the semiconductor package 80 while protecting the low-density conductive silicone part 134, thereby minimizing wear and damage to the conductive silicone member 130 otherwise caused by the pressure of the semiconductor package 80.

The high-density conductive silicone part 132 has somewhat stronger metallic properties than the low-density conductive silicone part 134, so the silicone connector 200 can withstand higher contact pressure from the semiconductor package 80 than would a silicone connector having only a low-density conductive silicone member. Accordingly, electrical contact is more reliable, as is testing. At the same time, the invented connector 200 exhibits lower contact pressure than would a silicone connector having metal plates. Thus, the connector 200 does not wear out or become damaged from repeated use. The high-density conductive silicone part 132 also has stronger shock-absorbing properties than a metal plate, thereby forming a robust electric connection with the solder ball 81 of the semiconductor package 80 without excessive contact pressure by the semiconductor package 80.

Second Example Embodiment

Figure 10:
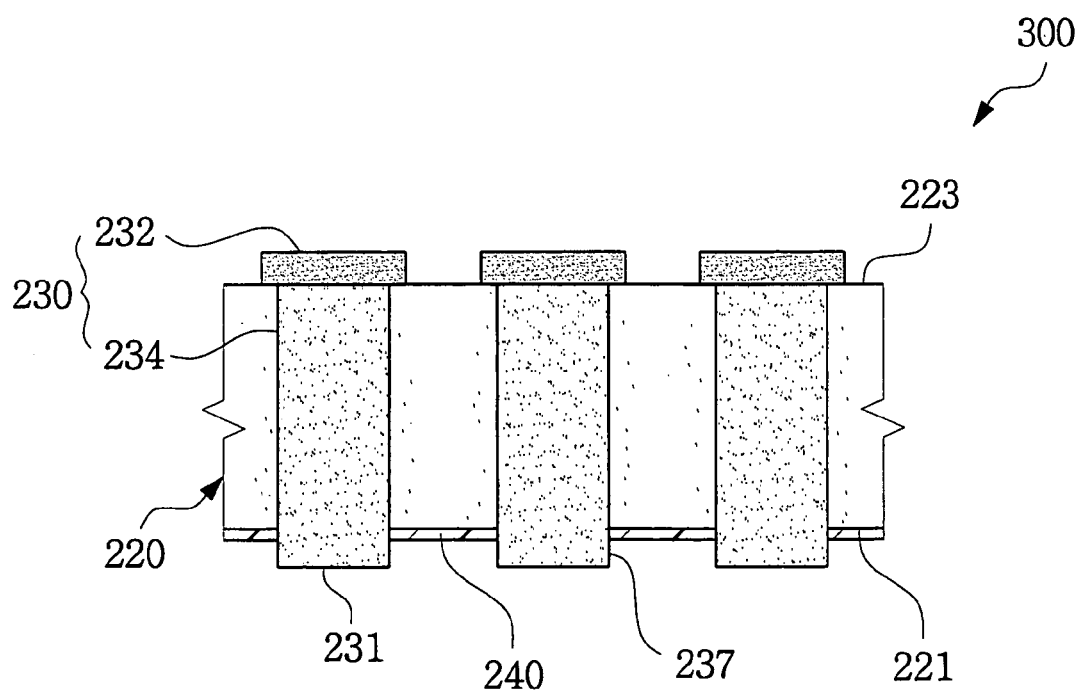
FIG. 10 is a sectional front elevation showing a silicone connector for testing a semiconductor package according to a second embodiment of the present invention.
Figure 11:
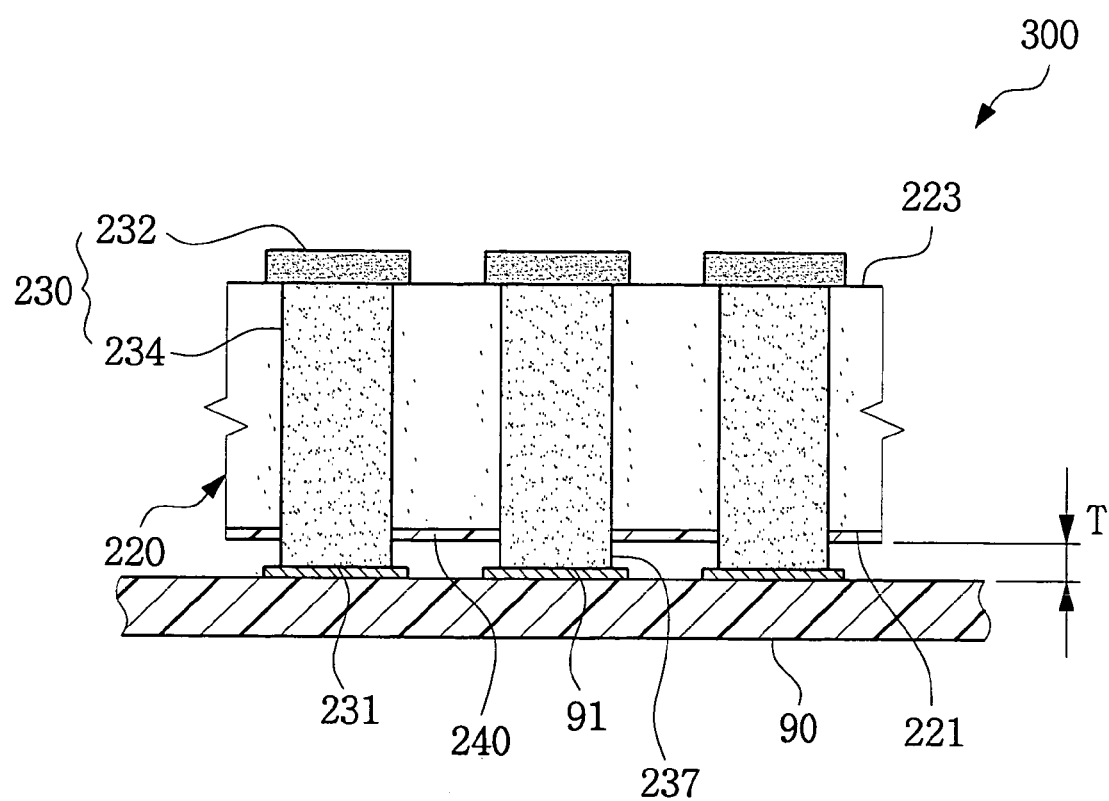
FIG. 11 is a sectional front elevation showing the silicone connector of FIG. 10 installed on a test substrate.

Alternatively to the first example embodiment, the lower surface of the low-density conductive silicone part can be formed to protrude a pre-defined distance below the lower surface 221 of a connector body 220, as shown in FIGS. 10 and 11. A silicone connector 300 according to a second example embodiment thus has a structure identical with that of the silicone connector according to the first example embodiment, except that the lower end 237 of a low-density conductive silicone part 234 including a lower surface 231 thereof is formed to protrude below the lower surface 221 of the connector body 220.

To support the protruding lower end 237 of the low-density conductive silicone part 234, a support layer, e.g. a strip or tape, 240 may be adhered to the lower surface 221 of the connector body 220 excluding the portion occupied by the protruding lower end 237 of the low-density conductive silicone part 234. Instead of the support layer 240, a silicone adhesive can be applied to a periphery of the lower end 237 of the low-density conductive silicone part 234.

The lower end 237 of the low-density conductive silicone part 234 protruding from the lower surface 221 of the connector body 220 allows the low-density conductive silicone part 234 to elastically contact with a substrate pad 91 of the test substrate 90, and to spread the contact load from the semiconductor package over the lower surface 221 of the connector body 220. Thus, the protruding lower end 237 of the low-density conductive silicone part 234 provides a more stable electrical connection with the test substrate 90. This is achieved in accordance with the second example embodiment of the invention through the elastic contact provided by the low-density conductive silicone part 234 against the test substrate 90.

Upon installation on the test substrate 90, the silicone connector 300 according to the second example embodiment allows a wider gap T between the lower surface 221 of the connector body 220 and the test substrate 90 in comparison with a silicone connector in which the lower surface of the low-density conductive silicone part and the lower surface of the connector body are coplanar. Consequently, when the semiconductor package presses the silicone connector 300, the upper surface 223 and the lower surface 221 of the connector body 220 both bulge outwardly and absorb the pressure. Therefore, the gap T between the silicone connector 300 and the test substrate 90 provides the lower surface 221 of the connector body 220 with an ample space to expand toward the test substrate 90.

Third Example Embodiment

Figure 12:
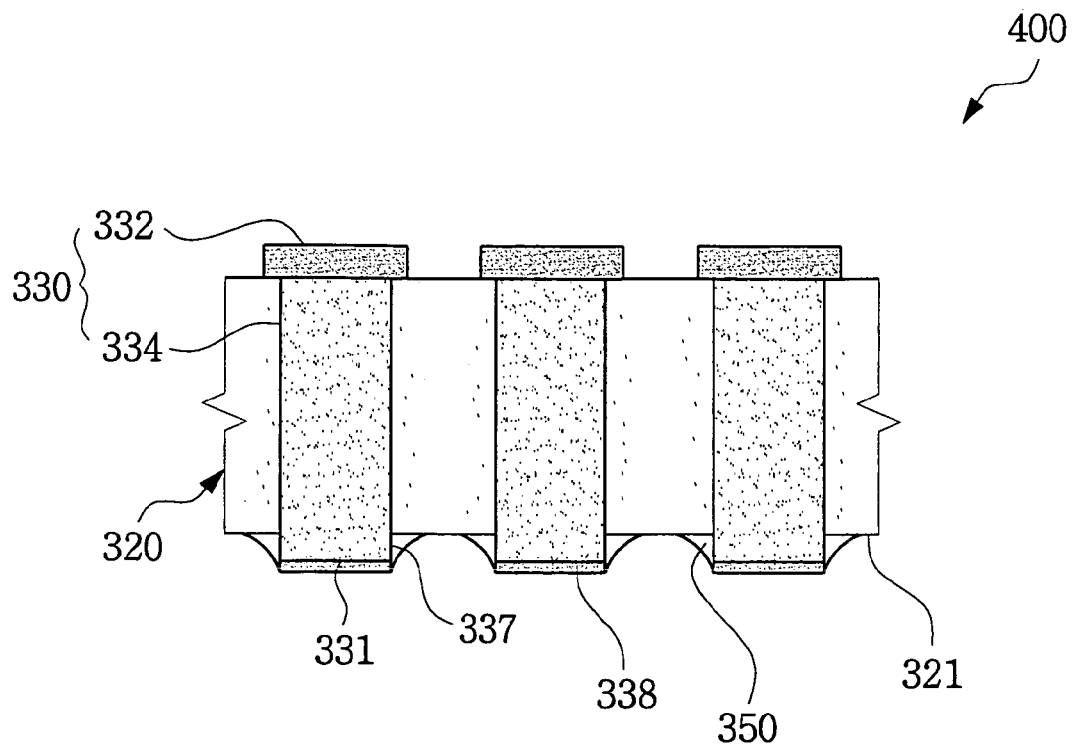
FIG. 12 is a sectional front elevation showing a silicone connector for testing a semiconductor package according to a third embodiment of the present invention.

As shown in FIG. 12, a silicone connector 400 according to a third example embodiment has a thin lower-surface high-density conductive silicone part 338 at the lower surface 331 of a low-density conductive silicone part 334 protruding from the lower surface 321 of a connector body 320. To support the protruding lower end 337 of the low-density conductive silicone part 334, a silicone adhesive 350 may be applied to a periphery thereof.

The lower-surface high-density conductive silicone part 338 may be made of the same materials as those of the high-density conductive silicone part 332. Considering the junction properties between the connector body 320 and the lower end 337 of the low-density conductive silicone part 334, it is preferable to make the silicone adhesive 350 with the same materials as those of the silicone powder utilized for the body 320 of the silicone connector 400.

The lower-surface high-density conductive silicone part 338 formed on the lower surface 331 of the low-density conductive silicone part 334 not only produces the same effects as described for the second example embodiment but also provides more robust contact with a substrate pad.

Fourth Example Embodiment

Each silicone connector according to the first, second, or third example embodiment has the high-density conductive silicone part that is formed on the upper surface of the connector body to cover or to cap the low-density conductive silicone part.

Figure 13:
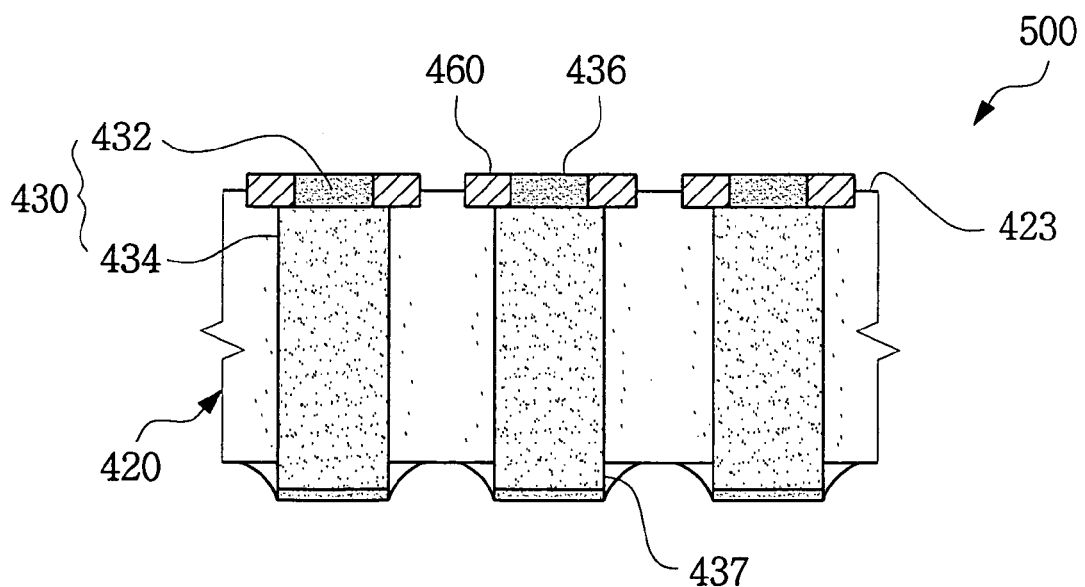
FIG. 13 is a sectional front elevation showing a silicone connector for testing a semiconductor package according to a fourth embodiment of the present invention.

As shown in FIG. 13, a silicone connector 500 according to a fourth example embodiment provides a metal ring 460 around a periphery of a high-density conductive silicone part 432. The lower end 437 of a low-density conductive silicone part 434 has the same structure as that of the silicone connector according to the third example embodiment; therefore it is not further explained here. The lower end 437 of the low-density conductive silicone part 434 alternatively can be formed to have the same structure as that of the silicone connector according to the first or second example embodiment, as will be understood by those of skill in the art.

The silicone connector 500 according to the fourth example embodiment is explained in detail as follows. The high-density conductive silicone part 432 is formed by filling a silicone mixture within a cylindrical interior space defined by interior periphery of the metal ring 460, which is formed to a predefined depth with respect to the upper surface 423 of a connector body 420. The low-density conductive silicone part 434 is formed below the metal ring 460. The silicone mixture described above in relation to the first example embodiment can also be used for a conductive silicone member 430. Accordingly, it is not further explained here.

The low-density conductive silicone part 434 is formed to have a diameter greater than that of the high-density conductive silicone part 432, as shown, the high-density conductive silicone part 432 being confined within the periphery of the metal ring 460.

Preferably, the metal ring 460 is made of beryllium copper (BeCu). It may also be made of other metals, within the spirit and scope of the invention.

For stable contact between a solder ball of a semiconductor package and the upper surface 436 of the high-density conductive silicone part 432, it is preferable that the upper end of the metal ring 460 protrudes slightly from the upper surface 423 of the connector body 420. Moreover, the upper surface 436 of the high-density conductive silicone part 432 is preferably substantially co-planar with the upper surface of the metal ring 460.

In the silicone connector 500 according to the fourth example embodiment, a solder ball of a semiconductor package mainly contacts with the upper surface 436 of the high-density conductive silicone part 432, thereby reducing the amount of mechanical stress exerted on the low-density conductive silicone part 434. In addition, the metal ring 460 formed on the exterior periphery of the high-density conductive silicone part 432 prevents separation of the high-density conductive silicone part 432 and further reduces the amount of mechanical stress exerted on the low-density conductive silicone part 434.

Considering the silicone connector disclosed in Korean Utility Model Gazette No. 278989, it may be of concern that the metal ring 460 itself might detach from the high-density conductive silicone part 432. While the silicone connector disclosed in Korean Utility Model Gazette No. 278989 has a metal ring attached to a low-density conductive silicone member, the silicone connector 500 according to the fourth example embodiment has the metal ring 460 attached to the high-density conductive silicone part 432, so there is yet another structural difference between the invention and the prior art. In comparison with the low-density conductive silicone part 434, the high-density conductive silicone part 432 has a higher concentration of the conductive powder, and hence has stronger metallic properties and a smaller coefficient of elasticity. Consequently, although the high-density conductive silicone part 432 repeatedly experiences pressure from a semiconductor package during tests, a small amount of contraction and expansion of the high-density conductive silicone part 432 gives the metal ring 460 little probability of detachment from the high-density conductive silicone part 432.

Figure 14:
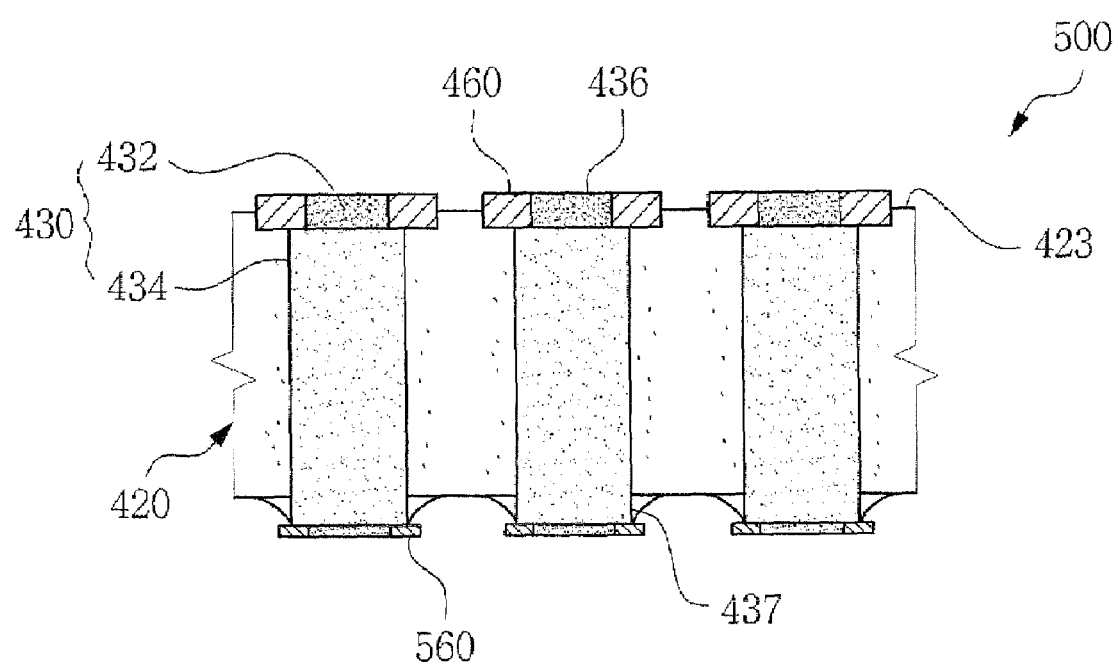
FIG. 14 is a sectional front elevation showing a silicone connector for testing a semiconductor package according to another embodiment of the present invention.

On the other hand, in the first through third example embodiments, the high-density conductive silicone part is formed only on the upper surface of the connector body. Another high-density conductive silicone part can also be formed on the lower surface of the connector body. In the fourth example embodiment, the metal ring is attached to the high-density conductive silicone part at the upper surface of the connector body. Another metal ring (see. e.g., 560 at FIG. 14) can also be formed to attach to the high-density conductive silicone part at the lower surface of the connector body.

Accordingly, the invention in its many embodiments provides the following advantages. First, the high-density conductive silicone part that contacts with a solder ball of a semiconductor package is formed at the upper portion of the low-density conductive silicone member. The high-density conductive silicone part thus absorbs the pressure from the semiconductor package, thereby preventing wear or damage to the low-density conductive silicone part.

Second, the high-density conductive silicone part represents a far better shock absorber than does a metal plate, yet it exhibits stronger metallic properties than does the low-density conductive silicone part. Although the silicone connector according to the invention experiences higher contact pressure from the semiconductor package compared with a conventional silicone connector having low-density conductive silicone members alone, nevertheless it is capable of minimizing wear and damage to the low-density conductive silicone part without an excessive increase in contact pressure.

Third, the high-density conductive silicone part protects the low-density conductive silicone part acting as an elastic body, thereby lengthening the life span of the silicone connector.

Fourth, the high- and low-density conductive silicone parts have identical compositions except for a difference in concentration of the conductive powder, thereby leading to good junction properties at their interface.

Fifth, the high and low-density conductive silicone part is made using existing manufacturing methods, thereby minimizing any increase in manufacturing costs due to the high-density conductive silicone part.

Finally, the substrate-contacting portion of the low-density conductive silicone part can be made to protrude from the lower surface of the connector body, thereby allowing the low-density conductive silicone part elastically to contact with a substrate pad of a test substrate and to spread the contact load from a semiconductor package over the lower surface of the connector body.

While example embodiments of the invention have been shown and described in this specification, it will be understood by those skilled in the art that various changes or modifications of the embodiments are possible without departing from the spirit of the invention as defined by the appended claims.

What is claimed is:

1. A connector for testing a semiconductor package, the connector comprising:
   a connector body comprising silicone powder; and
   a conductive silicone member that includes:
      a first conductive silicone part that is proximate an upper surface of the connector body and protrudes therefrom,
      a second conductive silicone part in substantial vertical alignment beneath the first conductive silicone part, the first conductive silicone part having a higher concentration of a conductive powder than the second conductive silicone part, the second conductive silicone part having its lower surface exposed from a lower surface of the connector body, the second conductive silicone part made by forced migration of the conductive powder to a site of the connector corresponding to a solder ball of the semiconductor package, and
   a metal ring formed on a periphery of the first conductive silicone part.

2. The connector of claim 1, wherein the first conductive silicone part is formed on the upper surface of the connector body.

3. The connector of claim 2, wherein the first conductive silicone part substantially covers an upper surface of the second conductive silicone part.

4. The connector of claim 3, wherein a lower end of the second conductive silicone part protrudes from the lower surface of the connector body.

5. The connector of claim 4, further comprising a support layer adhered to the lower surface of the connector body, wherein the lower end of the second conductive silicone part is exposed by the support layer.

6. The connector of claim 5, wherein the support layer comprises a polyimide.

7. The connector of claim 4, wherein a silicone adhesive is applied to a periphery of the lower end of the second conductive silicone part to support the protruding lower end thereof.

8. The connector of claim 1, wherein the metal ring comprises beryllium copper (BeCu).

9. The connector of claim 8, wherein a lower end of the second conductive silicone part protrudes from the lower surface of the connector body.

10. The connector of claim 9, further comprising a support layer adhered to the lower surface of the connector body excluding the portion occupied by the lower end of the second conductive silicone part.

11. The connector of claim 10, wherein the support layer comprises a polyimide.

12. The connector of claim 9, wherein a silicone adhesive is applied to a periphery of the lower end of the second conductive silicone part to support the protruding lower end thereof.

13. The connector of claim 9, wherein a third conductive silicone part is formed on the lower surface of the second conductive silicone part, the third conductive silicone part having a higher concentration of the conductive powder than the second conductive silicone part.

14. The connector of claim 1, wherein the first conductive silicone part has a concentration of between approximately 80 and 90 percent conductive powder, with the approximately 10-20 percent balance being silicone powder.

15. The connector of claim 1, wherein the conductive powder forming the conductive silicone member is a metallic powder comprises gold (Au)-coated nickel (Ni) particles.

16. The connector of claim 1 which further comprises:
a third conductive silicone part formed at the lower surface of the second conductive silicone part, the third conductive silicone part having a higher concentration of the conductive powder than the second conductive silicone part.

17. The connector of claim 16 which further comprises:
a metal ring formed on a periphery of the third conductive silicone part.

18. The connector of claim 17, wherein the metal ring comprises beryllium copper (BeCu).

19. The connector of claim 1, wherein the first conductive silicone part contacts the upper surface of the connector body.

20. The connector of claim 1, wherein a width of the first conductive silicone part is less than a width of the second conductive silicone part.

21. The connector of claim 1, wherein a lower surface of the first conductive silicone part is below the upper surface of the connector body.

22. The connector of claim 1, wherein a lower surface of the metal ring is below the upper surface of the connector body.

23. A semiconductor package test connector comprising:
an connector body, and
one or more conductive members within said connector body positioned to correspond with a conductive ball of the semiconductor package, each of the conductive members including:
a high-density conductive region proximate an upper surface of the connector body and protruding therefrom,
a low-density conductive region in substantial vertical alignment beneath the high-density conductive region, the low-density conductive region having its lower surface exposed from a lower surface of the connector body; and
a metal ring formed on a neriphery of the high-density conductive region,
wherein a lower surface of the metal ring is below the upper surface of the connector body.

24. The test connector of claim 23, wherein the high-density conductive region is formed on the upper surface of the connector body.

25. The test connector of claim 24, wherein the high-density conductive region substantially covers an upper surface of the low-density conductive region.

26. The test connector of claim 25, wherein a lower end of the low-density conductive region protrudes from the lower surface of the connector body.

27. The test connector of claim 26, further comprising a support layer adhered to the lower surface of the connector body, wherein the lower end of the low-density conductive region is exposed by the support layer.

28. The test connector of claim 23, wherein the high-density conductive region has a concentration of between approximately 80 and 90 percent conductive powder, with the approximately 10-20 percent balance being silicone powder.

29. The test connector of claim 23, wherein a material comprised within the high-density conductive region is the same as a material comprised within the low-density conductive region.

30. The test connector of claim 23, wherein the high-density conductive region contacts the upper surface of the connector body.

31. The test connector of claim 23, wherein a width of the high-density conductive region is less than a width of the low-density conductive region.

32. The test connector of claim 23, wherein a lower surface of the high-density conductive region is below the upper surface of the connector body.

* * * * *